United States Patent [19]
Teoh et al.

[11] Patent Number: 6,120,216
[45] Date of Patent: Sep. 19, 2000

[54] MODULAR FEEDER SYSTEM AND FEEDER MODULE FOR SUPPLYING ELECTRICAL COMPONENTS TO A PICK UP LOCATION

[75] Inventors: Ping Chow Teoh, Kedah; Ka Teik Lim; Kon Hing Chooi, both of Penang, all of Malaysia

[73] Assignee: Motorola Malaysia SDN BHD, Malaysia

[21] Appl. No.: 09/127,938

[22] Filed: Aug. 3, 1998

[51] Int. Cl.[7] .................................................. B65G 53/36

[52] U.S. Cl. ................................ 406/124; 406/1; 406/12; 406/29; 406/95; 406/145; 406/191; 406/198

[58] Field of Search ............................... 406/1, 3, 10, 12, 406/28, 29, 85, 93, 95, 108, 117, 118, 119, 120, 124, 191, 196, 198

[56] References Cited

U.S. PATENT DOCUMENTS

| | | | |
|---|---|---|---|
| 4,423,987 | 1/1984 | Powers | 406/120 |
| 4,722,641 | 2/1988 | Reeves | 406/95 |
| 6,024,208 | 2/2000 | Chooi et al | 406/85 |
| 6,039,512 | 3/2000 | Chooi et al. | 406/85 |

*Primary Examiner*—Christopher P. Ellis
*Assistant Examiner*—Joe Dillon, Jr.
*Attorney, Agent, or Firm*—Dale W. Dorinski

[57] ABSTRACT

A modular feeder system (1) for supplying electrical components to a pick-and-place machine (14). The feeder system (1) has a two dimensional array of electrical component feeder modules (3), an electrical component storage hopper (4), a pick up location (5) and a component transfer passage (6) allowing component transfer from the hopper (4) to the pick up location (5). Further, the modules (3) are selectively removable from said array.

17 Claims, 2 Drawing Sheets

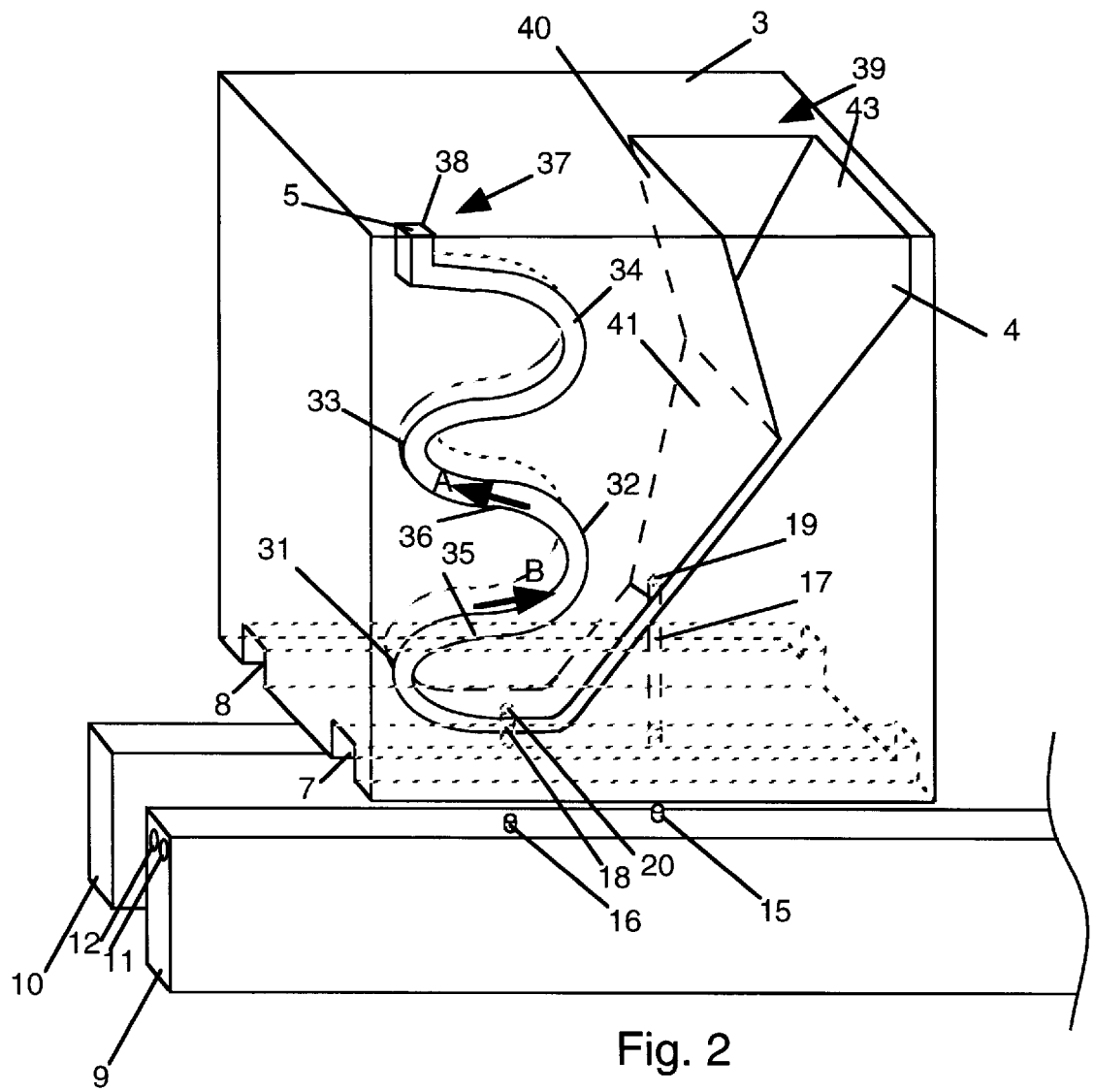
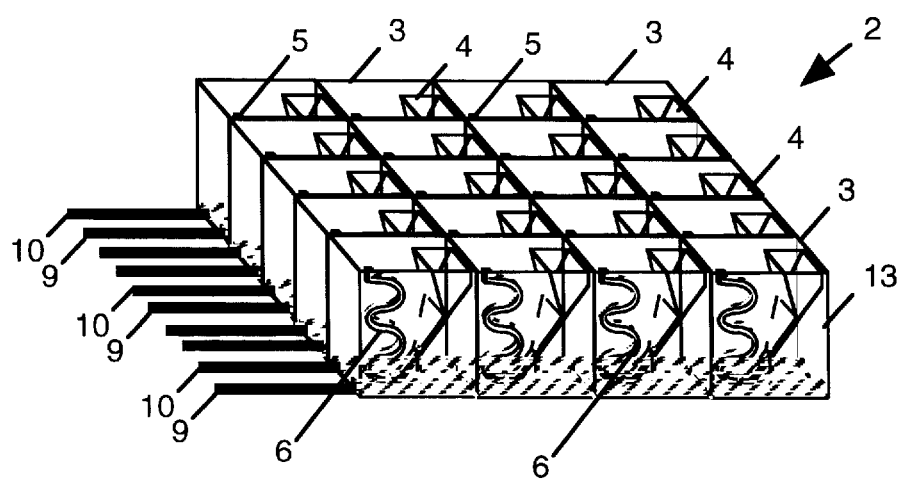
Fig. 2
Fig. 3

6,120,216

MODULAR FEEDER SYSTEM AND FEEDER MODULE FOR SUPPLYING ELECTRICAL COMPONENTS TO A PICK UP LOCATION

FIELD OF THE INVENTION

This invention relates to a modular feeder system and feeder module for supplying electrical components to a pick up location. The invention is particularly useful for, but not necessarily limited to, supplying surface mountable electrical components, stored in hoppers, to pick up locations for subsequent mounting to a circuit board.

BACKGROUND ART

Component feeding is a well-known process in Surface Mounting Technology (SMT). In general, a feeder is used to sequentially supply surface mountable electrical components to a pick up location for subsequent placing, by a pick-and-place machine, onto a Printed Circuit Board (PCB) which is pre-printed with solder paste.

One form of feeder is a tape and reel feeder in which the electrical components are packaged on a tape that is wound onto a reel. The tape comprises individual pockets each containing one of the electrical components that are individually sealed in the pockets by a covering of thin film. In use, the film is removed when the tape enters the pick up location therefore leaving a pocket containing one of the electrical components in a position accessible by the pick-and-place machine. Unfortunately, the tape is substantially wider than the components located in the pockets thereby increasing the width of the feeder. Further, the tape can jam which may take unnecessary time to clear and the flexibility of such feeders in not always adequate for accommodating rapid machine reconfiguration.

Hopper feeders also known as bulk or tube feeders are an alternative to tape and reel feeders. Hopper feeders usually comprise a hopper in communication, along a passage, with a pick up location. To provide propulsion of the components to the pick up location a combination of gravity and air blasting is generally used. However, the components can sometimes get jammed in the passage causing unnecessarily long machine downtime periods whilst the jam is being cleared. Further, such hopper feeders may not readily be replaced with different sized feeders accommodating different sizes and types of components, without causing undesirable delays in machine downtime.

SUMMARY OF THE INVENTION

It is an aim of this invention to overcome or alleviate at least one of the problems associated with prior art feeder systems and feeder modules for supplying components to a pick up location.

According to one aspect of this invention there is provided a modular feeder system for supplying electrical components to a pick-and-place machine, the feeder system comprising a two dimensional array of electrical components feeder modules associated with said pick-and-place machine, each of said modules having at least one electrical component storage hopper, a pick up location and a component transfer passage allowing component transfer from said hopper to said pick up location, wherein at least some of said modules are selectively removable from said array.

Preferably, said passage may have at least two substantially U shaped lengths therein.

Suitably, said passage may have at least two component supporting surface sections aligned in separate substantiality horizontal planes, wherein a first one of said of said supporting surface sections is substantially directly above a second one of said supporting surface sections.

Preferably, said passage may have at least two component supporting surface sections, wherein in use a first one of said component supporting surface sections allows for component propulsion in a direction substantially opposite to that allowed by a second one of said component supporting surface sections.

Preferably, said array may be matrix.

Suitably, each of said modules may have an external surface adjacent an outlet aperture of a respective pick up location, said external surface being above or at least in alignment with an uppermost external surface adjacent said hopper.

Suitably, each hopper may have agitation means associated therewith for agitating electrical components therein to thereby align and transfer at least one of said components into said passage.

Preferably, there may be an electrical component propulsion means associated with each passage for propelling said components in said passage to all said pick up location.

Suitably, said agitation means may comprise at least one air jet outlet operatively coupled to a compressed air supply.

Preferably, said propulsion means may comprise at least one air jet outlet operatively coupled to a compressed air supply.

Suitably, said feeder modules may releasable and selectively mountable to a mounting means, said mounting means having passages associated therewith for operatively coupling said first and second air jet outlet to said compressed air supply.

Preferably, said mounting means may have a feeder module positioning means that also provides for operatively coupling said first and second air jet outlet to said compressed air supply.

Suitably, each said hopper may comprise a first funnel portion for guiding components into a second funnel portion, wherein said second funnel portion is adapted to receive said components such that a surface thereof is aligned to an alignment plane, and wherein said second funnel portion is adapted to funnel said components into said hopper outlet.

According to another aspect of the invention, there is provided a feeder module for use in a modular feeder system said feeder module having at least one electrical component storage hopper, a pick up location and a component transfer passage allowing component transfer from said hopper to said pick up location, wherein said module is selectively removable from a two dimensional array of feeder modules associated with a pick-and-place machine.

Suitably, said passage may have at least two substantially U shaped lengths therein.

Preferably, said passage may have at least two component supporting surface sections aligned in separate substantiality horizontal planes, wherein a first one of said of said supporting surface sections is substantially directly above a second one of said supporting surface sections.

Suitably, said passage may have at least two component supporting surface sections, wherein in use a first one of said component supporting surface sections allows for component propulsion in a direction substantially opposite to that allowed by a second one of said component supporting surface sections.

BRIEF DESCRIPTION OF THE DRAWINGS

In order that the invention may be readily understood and put into practical effect, reference will now be made to preferred embodiments illustrated in the accompanying drawings in which:

FIG. 2 is a perspective view of a component feeder module comprising part of the modular feeder system of FIG. 1; and FIG. 3 is a perspective view of a plurality of component feeder modules of FIG. 2.

DETAILED DESCRIPTION OF THE PREFERRED EMBODIMENT OF THE INVENTION

Figure 1:
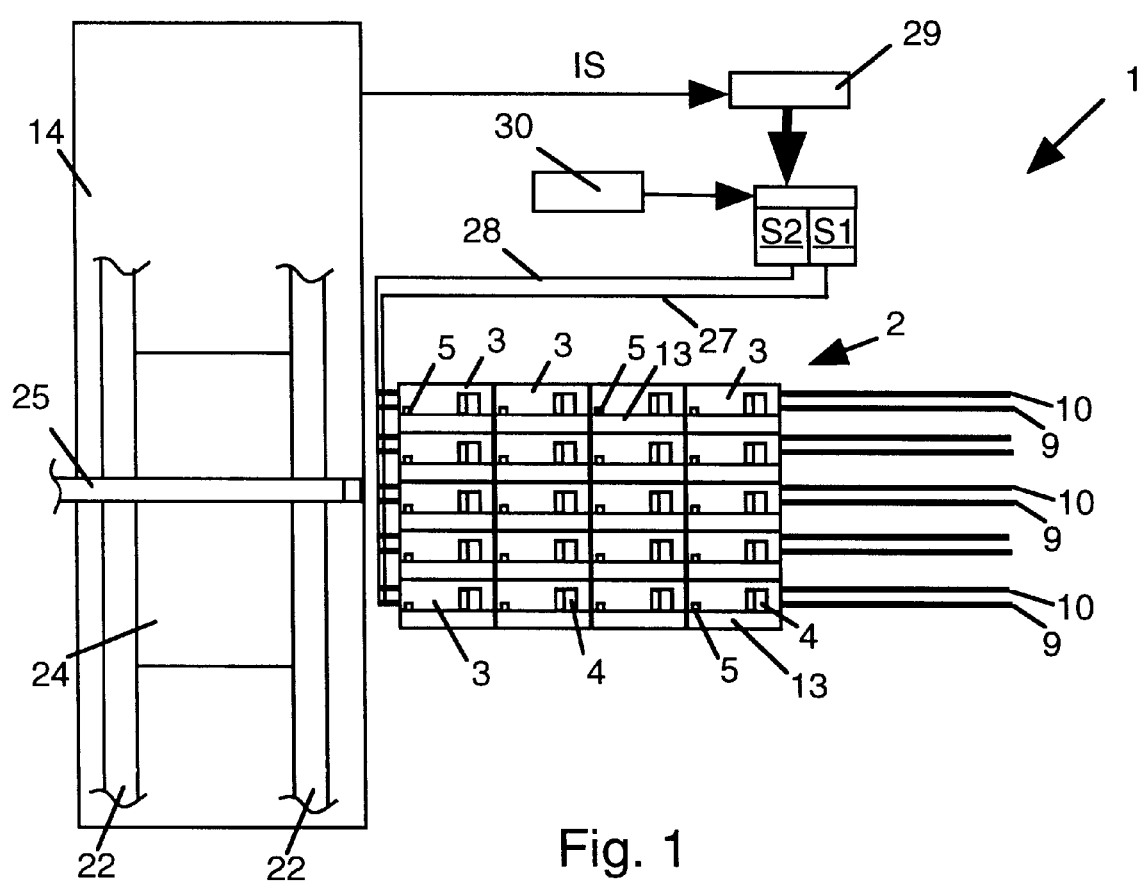
FIG. 1 is a schematic plan view of a preferred embodiment of a modular feeder system, in accordance with this invention, when located adjacent a pick-and-place machine.

Referring to FIGS. 1 to 3 there is illustrated a modular feeder system 1 for supplying electrical components to pick-and-place machine 14. The feeder system 1 comprises a two dimensional array 2, in the form of a matrix, of electrical components feeder modules 3 associated with the pick-and-place machine 14. Each of modules 3 has an electrical component storage hopper 4, a pick up location 5 and a component transfer passage 6 allowing component transfer from the hopper 4 to the pick up location 5. Each of the component feeder modules 3 have mounting slots 7,8 engageble with respective mounting means in the form of mounting beams 9, 10. Each of the beams 9 have two fluid passages 11,12 operatively coupled to respective outlet protrusions 15,16. Such outlet protrusions 15,16 are spaced along each of beams 9 and operatively engage respective fluid passages 17,18 machined into a component feeder module 3. Accordingly, the assembly of mounting beams 9, 10 when engaging with respective slots 7,8 allows releasable mounting and the selective removal of any of the component modules 3 from the array 2. Further, the protrusions 15,16 when engaged in the respective fluid passages 17, 18 provide for correct positioning of a component feeder module 3 and also allow for air to be supplied through passages 11,12 to respective passages 17,18.

Each of the component feeder modules 3 has a first fluid jet outlet 19 associated with hopper 4 to allow for agitating components in the hopper 4 so that some of them may drop into the passage 6. There is second fluid jet outlet 20 associated with the passage 6, for propelling the components that have dropped into the passage 6 towards the pick up location 5. As illustrated the first and second fluid jet outlets 19,20 are respectively coupled to the fluid passages 17,18. The passage 6, pick up location 5 and hopper 4 are machined into surface of each one of the component feeder modules 3 and enclosed by a transparent plate 13 that is glued and bolted thereto(bolts not shown).

As specifically illustrated in FIG. 1, the fluid passages 17,18 are operatively coupled to respective solenoid valves S1,S2 by flexible piping 27,28. The solenoid valves S1,S2 selectively allow for coupling of piping 27,28 to a pressurised air supply means in the form of a compressor 30. There is also a controller 29 associated with the pick and place machine 14 for use in selectively controlling the solenoid valves S1,S2.

The feeder system 1 is located adjacent a conveyor track 22 of the pick-and-place machine 14. The conveyor track 22 is used to transport a printed circuit board 24 to a position near the pick up locations 5 so that a robot arm 25 (or some other pick up device such as a carousel) can remove the components in each pick up location 5. The robot arm 25 sequentially places the components onto the board 24 in their required positions.

The component transfer passage 6 has a number of substantially U shaped lengths 31,32,33,34 and component supporting surface sections 35,36 aligned in separate substantiality horizontal planes. Further, a first one of the supporting surface sections 36 is substantially directly above a second one of the supporting surface sections 35. Additionally, in use the first one of the component supporting surface sections 36 allows for component propulsion in a direction of arrow A which is substantially opposite to that allowed by the second one of the component supporting surface sections 35 (which allows component propulsion in a direction of arrow B).

As best illustrated in FIG. 3, each of the component feeder modules 3 has an external surface 37 adjacent an outlet aperture 38 of a respective pick up location 5, this external surface being above or at least in alignment with an uppermost external surface 39 adjacent the hopper 4.

In operation the controller 29 will control solenoid valves S1,S2 to allow pulsed air blasts to be provided alternatively through fluid jet outlet 19 and fluid jet outlet 20. Accordingly, after each air blast through the first fluid jet outlet 19, one or more components 20 may drop through the into the passage 6. Similarly, after each air blast through the second fluid jet outlet 20, some of the components that have dropped into passage 6 will be propelled along the passage 6. After each alternate air blast through fluid jet outlet 20, some of the components may slide down the passage 6 due to the effects of gravity. Hence, the U shaped lengths 31,32,22,34 and surface sections 35,36 aligned in separate substantiality horizontal planes restricts the effects of gravity and thus not all the components will necessarily slide down the passage.

Each hopper 4 comprises a first funnel portion 40 for guiding components into a respective second funnel portion 41. Each hopper 4 is adapted to receive the components such that one surface of the hopper 4 is aligned in an alignment plane comprising a hopper surface 43. Further, the second funnel portion is shaped to funnel the components the passage 6.

The present invention, as will be apparent to a person skilled in the art, allows for selective removal of the component feeder modules 3. Accordingly, this provides improved machine reconfiguration flexibility and also reduces machine downtime.

Although this invention has been described with reference to a preferred embodiment, it is to be understood that the invention is not limited to the specific embodiment described herein. For example, two or more hoppers and associated pick up locations may be machined into one component feeder module 3.

We claim:

1. A modular feeder system for supplying electrical components to a pick-and-place machine, the feeder system comprising a two dimensional array of electrical components feeder modules associated with said pick-and-place machine, each of said modules having at least one electrical component storage hopper, a pick up location and a component transfer passage allowing component transfer from said hopper to said pick up location, wherein at least some of said modules are selectively removable from said array.

2. A modular feeder system as claimed in claim 1, wherein said passage has at least two substantially U shaped lengths therein.

3. A modular feeder system as claimed in claim 1, wherein said passage has at least two component supporting surface sections aligned in separate substantiality horizontal planes, wherein a first one of said supporting surface sections is substantially directly above a second one of said supporting surface sections.

4. A modular feeder system as claimed in claim 1, wherein said passage has at least two component supporting surface sections, and wherein in use a first one of said component supporting surface sections allows for component propulsion in a direction substantially opposite to that allowed by a second one of said component supporting surface sections.

5. A modular feeder system as claimed in claim 1, wherein said array is a horizontal matrix.

6. A modular feeder system as claimed in claim 1, wherein each of said modules has an external surface adjacent an outlet aperture of a respective pick up location, said external surface being above or at least in alignment with an uppermost external surface adjacent said hopper.

7. A modular feeder system as claimed in claim 1, wherein each said hopper may comprise a first funnel portion for guiding components into a second funnel portion, said second funnel portion being adapted to receive said components such that a surface thereof is aligned to an alignment plane, and wherein said second funnel portion is adapted to funnel said components into said hopper outlet.

8. A modular feeder system as claimed in claim 1, wherein each hopper has an agitation means associated therewith for agitating electrical components therein to thereby align and transfer at least one of said components into said passage.

9. A modular feeder system as claimed in claim 8, wherein there is an electrical component propulsion means associated with each passage for propelling said components in said passage to all said pick up location.

10. A modular feeder system as claimed in claim 9, wherein said agitation means comprises at least one air jet outlet operatively coupled to a compressed air supply.

11. A modular feeder system as claimed in claim 10, wherein said propulsion means comprises at least one air jet outlet operatively coupled to said compressed air supply.

12. A modular feeder system as claimed in claim 11, wherein said feeder modules are releasable and selectively mountable to a mounting means, said mounting means having passages associated therewith for operatively coupling said first and second air jet outlet to said compressed air supply.

13. A modular feeder system as claimed in claim 12, wherein said mounting means has a feeder module positioning means that also provides for operatively coupling said first and second air jet outlet to said compressed air supply.

14. A feeder module for use in a modular feeder system which forms a two dimensional array for feeding electrical components. said feeder module having at least one electrical component storage hopper, a pick up location and a component transfer passage allowing component transfer from said hopper to said pick up location, wherein said module is selectively removable by a mating engagement with the from a two dimensional array of feeder modules associated with a pick-and-place machine.

15. A feeder module as claimed in claim 14, wherein said passage has at least two substantially U shaped lengths therein.

16. A feeder module as claimed in claim 14, wherein said passage has at least two component supporting surface sections aligned in separate substantiality horizontal planes, wherein a first one of said of said supporting surface sections is substantially directly above a second one of said supporting surface sections.

17. A feeder module as claimed in claim 14, wherein said passage has at least two component supporting surface sections, and wherein in use a first one of said component supporting surface sections allows for component propulsion in a direction substantially opposite to that allowed by a second one of said component supporting surface sections.

* * * * *